(12) United States Patent
Hellstrom et al.

(10) Patent No.: US 11,552,210 B2
(45) Date of Patent: Jan. 10, 2023

(54) POLYMER COMPOSITION FOR PHOTOVOLTAIC APPLICATIONS

(71) Applicant: Borealis AG, Vienna (AT)

(72) Inventors: Stefan Hellstrom, Stenungsund (SE); Francis Costa, Linz (AT); Bert Broeders, Beringen (BE)

(73) Assignee: BOREALIS AG, Vienna (AT)

( * ) Notice: Subject to any disclaimer, the term of this patent is extended or adjusted under 35 U.S.C. 154(b) by 0 days.

(21) Appl. No.: 16/619,025

(22) PCT Filed: Jun. 14, 2018

(86) PCT No.: PCT/EP2018/065812
§ 371 (c)(1),
(2) Date: Dec. 3, 2019

(87) PCT Pub. No.: WO2018/229191
PCT Pub. Date: Dec. 20, 2018

(65) Prior Publication Data
US 2020/0098941 A1   Mar. 26, 2020

(30) Foreign Application Priority Data

Jun. 16, 2017 (EP) .................... 17176291

(51) Int. Cl.
*H01L 31/048* (2014.01)
*H01L 31/049* (2014.01)
(Continued)

(52) U.S. Cl.
CPC ........ *H01L 31/0481* (2013.01); *C08F 210/02* (2013.01); *C08K 3/22* (2013.01);
(Continued)

(58) Field of Classification Search
CPC ............... H01L 31/0481; H01L 31/049; C08F 2800/10; C08F 2800/20
See application file for complete search history.

(56) References Cited

U.S. PATENT DOCUMENTS 3,646,155 A   2/1972   Henry
4,117,195 A   9/1978   Swarbrick et al.
(Continued)

FOREIGN PATENT DOCUMENTS

CN   101903452 A   12/2010
CN   101960616 A   1/2011
(Continued)

OTHER PUBLICATIONS

Japanese Application No. 2019-565207; Japanese Decision of Rejection dated May 11, 2021; 4 pgs.
(Continued)

*Primary Examiner* — Golam Mowla
(74) *Attorney, Agent, or Firm* — Tarolli, Sundheim, Covell & Tummino LLP

(57) ABSTRACT

The present invention relates to a polymer composition, to an article comprising the polymer composition, preferably to an article which is a photovoltaic (PV) module comprising at least one layer element (LE) comprising the polymer composition and to a process for producing said article, preferably said photovoltaic (PV) module.

11 Claims, 1 Drawing Sheet

(51) Int. Cl.
  *C08F 210/02*  (2006.01)
  *C08K 3/22*  (2006.01)

(52) U.S. Cl.
  CPC ........ *H01L 31/049* (2014.12); *C08F 2800/10* (2013.01); *C08F 2800/20* (2013.01); *C08K 2003/2241* (2013.01); *Y02E 10/50* (2013.01)

(56) References Cited

U.S. PATENT DOCUMENTS

| | | | |
|---|---|---|---|
| 4,413,066 A | 11/1983 | Isaka et al. | |
| 2009/0159129 A1* | 6/2009 | Kataoka | H01L 31/0481 136/259 |
| 2010/0286308 A1 | 11/2010 | Carlsson | |
| 2011/0005592 A1* | 1/2011 | Kataoka | B32B 17/10678 136/256 |

FOREIGN PATENT DOCUMENTS

| | | |
|---|---|---|
| CN | 102057750 A | 5/2011 |
| EP | 736065 B1 | 10/1996 |
| EP | 1309631 B1 | 5/2003 |
| EP | 1309632 B1 | 5/2003 |
| EP | 2669960 A2 | 12/2013 |
| EP | 2892080 A1 | 7/2015 |
| EP | 3020759 A1 | 5/2016 |
| JP | 2008103471 A | 5/2001 |
| JP | 200994320 A | 4/2009 |
| JP | 2011222811 A | 11/2011 |
| JP | 2014090160 A | 5/2014 |
| JP | 2014170781 A | 9/2014 |
| KR | 10-2012-0085681 A | 8/2012 |
| WO | 2009/056407 A1 | 5/2009 |
| WO | 2009/126115 A1 | 10/2009 |
| WO | 2010/003503 A1 | 1/2010 |
| WO | 2011/160964 A1 | 12/2011 |
| WO | 2016/041924 A1 | 3/2016 |
| WO | WO-2016041922 A1 * | 3/2016 ........ C08L 23/0869 |
| WO | 2017/076628 A1 | 5/2017 |
| WO | 2017/076629 A1 | 5/2017 |
| WO | 2017076629 A1 | 5/2017 |

OTHER PUBLICATIONS

Applicant: Borealis AG; Korean Application No. 10-2019-7038407; Filed: Dec. 26, 2019; Korean Office Action dated Nov. 16, 2020; 14 pgs.
Applicant: Borealis AG; Japanese Application No. 2019-565207; Japanese Office Action dated Dec. 22, 2020; 9 pgs.
Office action for Taiwan Patent Application No. 107120485, dated Feb. 26, 2019.
James C. Randall, "A Review of High Resolution Liquid 13Carbon Nuclear Magnetic Resonance Characterizations Jf Ethylene-Based Polymers", C29 201, 1989.
Kaye, et al., "Definition of terms relating to the non-ultimate mechanical properties of polymers", Pure & Appl. Chem., vol. 70, pp. 701-754, 1998.
Heino, "The influence of molecular structure on some rheological properties of polyethylene", Annual Transactions of the Nordic Rheology Society, vol. 3, 1995.
Heino, E-L, et al., "Rheological Characterization of Polyethylene Fractions", Proc. Xlth Int. Congr. on Rheology, Brussels, Belgium, Aug. 17-21, 1992, pp. 360-362.
Extended search report for Application No. 17176291.7-1308, dated Nov. 3, 2017.
International Search report for Application No. PCT/EP2018/065812, dated Jul. 20, 2018.
"Ethylene Polymers, Hope", Encyclopedia of Polymer Science and Engineering, vol. 2, pp. 382-410.
"Polyethylene: High-pressure", Encyclopedia of Materials Science and Technology, 2001, pp. 7181-7184.
Australian Office Action for Application No. 2018285447 dated May 20, 2020.
Taiwan Office Action for Application No. 107120485 dated Aug. 28, 2020.
Applicant: Borealis AG; "A Polymer Composition for Photovoltaic Applications"; Chinese Application No. 201880036786.9; Chinese Office Action, dated Oct. 27, 2021; 16 pgs.

* cited by examiner

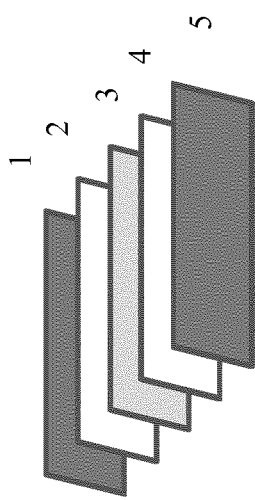

POLYMER COMPOSITION FOR PHOTOVOLTAIC APPLICATIONS

The present invention relates to a polymer composition, to an article comprising the polymer composition, preferably to an article which is a photovoltaic (PV) module comprising at least one layer element (LE) comprising the polymer composition and to a process for producing said article, preferably said photovoltaic (PV) module.

BACKGROUND ART

For instance photovoltaic (PV) modules, also known as solar cell modules, produce electricity from light and are used in various kinds of applications, i.a. in outdoor applications, as well known in the field. The type of the photovoltaic module can vary. The modules have typically a multilayer structure, i.e. several different layer elements which have different functions. The layer elements of the photovoltaic module can vary with respect to layer materials and layer structure. The final photovoltaic module can be rigid or flexible.

The above exemplified layer elements can be monolayer or multilayer elements. Typically the layer elements of PV module are assembled in order of their functionality and then laminated together to form the integrated PV module. Moreover, there may be adhesive layer(s) between the layers of an element or between the different layer elements.

The photovoltaic (PV) module can for example contain, in a given order, a protective front layer element which can be flexible or rigid (such as a glass layer element), front encapsulation layer element, a photovoltaic element, rear encapsulation layer element, a protective back layer element, which is also called a backsheet layer element and which can be rigid or flexible; and optionally e.g. an aluminium frame.

For encapsulation layer elements, such as the front or back encapsulation layer elements also polymer compositions based on ethylene polymer can be used. Silane groups containing units can be introduced into the polymer composition for instance for improving adhesion properties. Such silane containing units can be added a) as separate silane compounds, which are blended with the ethylene polymer, b) as silane groups containing units, which are grafted onto the polymeric backbone of a copolymer of ethylene with either alpha-olefin comonomer(s) or with polar comonomer(s), like alkyl acrylate comonomer or vinyl acetate comonomer, or c) by copolymerizing ethylene monomer together with polar comonomer(s) and silane groups containing comonomer to provide a copolymer of ethylene with said polar comonomer and with said silane comonomer.

The silane-grafted polyethylene or copolymer of ethylene containing silane groups containing comonomer can be then crosslinked, e.g. during or after lamination process of the photovoltaic (PV) module. Crosslinking of grafted silane groups containing units or silane groups containing comonomer of the polyethylene can be effected using peroxide or silane condensation catalyst, as well known and documented in the polymer field.

The grafting process (b) is usually conducted in the presence of a peroxide in a compounder in molten state, which is well known in the art. Such processes for grafting silane groups onto the polyethylene backbone are e.g. known from the Sioplas or Monosil cross-linking processes wherein said grafting is one step of the process which is followed by the crosslinking step. Sioplas process is described e.g. in U.S. Pat. No. 3,646,155, the Monosil process is described e.g. in U.S. Pat. No. 4,117,195. As further examples describing grafting, e.g. WO 2009/056407, U.S. Pat. Nos. 3,646,155 and 4,117,195 can be mentioned.

Moreover, the copolymerisation process (c) of ethylene monomer with silane groups containing comonomer for producing copolymer of ethylene with silane groups containing comonomer is well known and documented in the state of the art in the polymer field. Such copolymerisation process and of obtained copolymer of ethylene with silane groups containing comonomer, as well as use of said copolymer in polymer compositions suitable for encapsulation layer elements based on ethylene based polymers are disclosed e.g. in U.S. Pat. No. 4,413,066, WO 2010/003503, WO 2016/041924 and WO 2017/076629.

Accordingly, part or all of the layer elements of a PV module, e.g. the front and rear encapsulation layer elements, and often the backsheet layer, are typically of a polymeric material, like ethylene vinyl acetate (EVA) based material.

When using a transparent rear encapsulation layer element together with e.g. a polymeric protective back layer element, then e.g. the protective back layer element will be exposed to UV radiation at end use of the PV module. Such UV exposure can deteriorate the performance of the protective back layer element, and thus shorten the lifetime of the PV module. Therefore UV absorbing agent(s) are conventionally added to the encapsulation elements and to the polymeric protective back layer elements to prevent the deteriorating effect of the UV radiation. The UV absorbing agents have a drawback that e.g. they can cause undesired coloring effects, have limited lifetime as well as are relatively costly.

FIGURES

FIG. 1 illustrates the layer elements (separated) of a preferable embodiment of the invention, namely a protective front layer element (1), a front encapsulation layer element (2), a photovoltaic element (3), a rear encapsulation layer element (4) and a protective back layer element (5) of a photovoltaic module, wherein at least the rear encapsulation layer element (4) comprises the polymer composition of the invention.

THE DESCRIPTION OF THE INVENTION

Accordingly, the present invention is directed to a polymer composition comprising
  a polymeric component comprising a polymer of ethylene
    (a) which is selected from
    (a1) a polymer of ethylene which bears silane group(s) containing comonomer;
    (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1); or
    (a3) a copolymer of ethylene with one or more (C1-C10)-alpha-olefin comonomer which is different from polymer of ethylene (a1) and polymer of ethylene (a2); and
  a pigment (b), wherein the amount of the pigment (b) is less than 2.00 wt %, based on the amount of the polymer composition (100% wt).

The polymer composition is also referred herein as "polymer composition of the invention" or as the "composition of the invention" or "polymer composition".

The polymer of ethylene (a), as defined above, below or in claims, is referred herein also shortly as "polymer (a)".

The definition (a1) a polymer of ethylene which bears silane group(s) containing comonomer, as defined above, below or in claims, is referred herein also shortly as "polymer of ethylene (a1)" or "polymer (a1)".

The definition (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1), as defined above, below or in claims, is referred herein also shortly as "copolymer of ethylene (a2)", "copolymer (a2)" or "polymer (a2)".

The definition (a3) a copolymer of ethylene with one or more (C1-C10)-alpha-olefin comonomer which is different from polymer of ethylene (a1) and polymer of ethylene (a2), as defined above, below or in claims, is referred herein also shortly as "polymer (a3)".

As well known "comonomer" refers to copolymerisable comonomer units.

The polymer composition of the invention with the given low amount of the pigment (b) provides surprisingly good protection against UV radiation. Namely, the polymer composition absorbs and obstructs UV radiation. The blocking of UV radiation is indicated e.g. by transmittance measurements as shown in the experimental part.

Therefore the polymer composition of the invention is highly feasible for use in a layer element (LE) for instance for producing articles of two or more layer elements by lamination, since when the layer element (LE) comprising the polymer composition is used as the sunlight (UV radiation) receiving layer, then it can effectively block the UV radiation and thus protect the other layer(s) on the side opposite to sunlight receiving side.

Moreover, the polymer composition is highly suitable for articles, like for photovoltaic (PV) modules. For example, the use of the layer element (LE) of the polymer composition of the invention e.g. as a rear encapsulation element of the PV module improves the power output of the PV module by reflecting the photons back to photovoltaic element. The layer element (LE) of the polymer composition of the invention e.g. as a rear encapsulation element of the PV module can also contribute to the protection of a polymeric backsheet layer element of said PV module against UV radiation, by both absorbing the UV light and obstructing the transmission of the UV light through the rear encapsulation layer element to the backsheet layer element. This can be indicated e.g. by transmittance measurements as shown in the experimental part.

Further benefit of the present invention is that, if desired, polymer (a) does not need to be crosslinked using peroxide. Accordingly, the polymer composition of the invention enables to produce peroxide-free layer elements (LE).

Furthermore, the pigmented, preferably white pigmented, polymer composition of the invention can reflect photons of light surprisingly effectively, even with the given low amounts of the pigment (b). Such property is highly useful e.g. for photovoltaic applications. For instance, when the polymer composition is used as a rear encapsulation element in a photovoltaic (PV) module, wherein the rear encapsulation element comprises, preferably consists of, the polymer composition of the invention, then said rear encapsulation layer element preferably also reflects some of the photons that penetrate through inter-cell gap back to front side of the cells of the photovoltaic element. Thus the rear layer element of the polymer composition increases the probability of photons in getting absorbed by the front side of the solar cell which can lead to higher module output. Moreover, compared to embodiments wherein the backsheet of a photovoltaic (PV) module is pigmented, the pigmented rear encapsulation layer element which comprises, preferably consists of, the polymer composition of the invention, absorbs UV light and also reflects the photons earlier than the optionally pigmented, optionally white pigmented, backsheet layer element and thus reduces the UV light deteriorating effect on adjacent backsheet layer element and preferably removes the risk of getting the photons to be trapped behind the photovoltaic cells.

Moreover, storage stability of the composition of the invention is extremely good.

Moreover, preferably a layer element (LE) produced by the polymer composition of the invention has still surprisingly good adhesion, in other words, the pigment (b) does not have any adverse impact to the adhesion properties of the composition.

The invention further provides use of the polymer composition as defined above or below or in claims for producing a layer element (LE) comprising one or more layer(s), preferably one layer, which comprise the polymer composition of the invention.

The invention further provides a layer element (LE) of one or more layers, wherein one or more layer(s), preferably one layer, comprises the polymer composition as defined above or below or in claims. The layer element (LE) of the invention is referred herein also as layer element (LE).

The layer element (LE) means herein monolayer element or multilayer element, which element has a certain function, like encapsulation layer element in (PV) module functions i.a. to protect a photovoltaic layer element and to contribute to the photovoltaic activity of said photovoltaic layer element. The term "element" has a well acknowledged meaning in the state of the art.

The invention further provides use of the polymer composition as defined above or below or in claims for producing an article, preferably a photovoltaic (PV) module, comprising a layer element (LE) comprising one or more layer(s), preferably one layer, which comprises the polymer composition as defined above or below or in claims.

The invention further provides an article comprising the layer element (LE) of one or more layers, wherein one or more layer(s), preferably one layer, comprises the polymer composition as defined above or below or in claims.

The article is preferably a multilayer assembly comprising two or more layer elements, wherein at least one layer element is the layer element (LE).

The article is more preferably a photovoltaic (PV) module comprising a photovoltaic element and one or more further layer elements, wherein at least one layer element, preferably one layer element, is the layer element (LE), as defined above or below or in claims.

The invention further provides a photovoltaic (PV) module comprising, in the given order, a protective front layer element, a front encapsulation layer element, a photovoltaic element, a rear encapsulation layer element and a protective back layer element, wherein preferably the rear encapsulation layer element is the layer element (LE) of the invention, as defined above or below or in claims.

The invention further provides a process for producing a photovoltaic (PV) module comprising the steps of
assembling the photovoltaic element, the layer element (LE) and optional, and preferably, further layer elements to a photovoltaic (PV) module assembly;
laminating the layer elements of the photovoltaic (PV) module assembly in elevated temperature to adhere the elements together; and
recovering the obtained photovoltaic (PV) module; as defined above or below or in claims.

The polymer composition, the polymer (a), the layer element (LE), the article, preferably PV module, the use and process of the invention together with further details, preferred embodiments, ranges and properties thereof, are described below and in claims, which preferred embodiments, ranges and properties can be in any combination and combined in any order.

The Polymer Composition

The silane group(s) containing units can be present as a comonomer of the polymer (a) or as a compound grafted chemically to the polymer (a).

Accordingly, in case of silane group(s) containing units are incorporated to the polymer (a) as a comonomer, the silane group(s) containing units are copolymerized as comonomer with ethylene monomer during the polymerization process of polymer (a). In case the silane group(s) containing units are incorporated to the polymer by grafting, the silane group(s) containing units are reacted chemically (also called as grafting), with the polymer (a) after the polymerization of the polymer (a). The chemical reaction, i.e. grafting, is performed typically using a radical forming agent such as peroxide. Such chemical reaction may take place before or during the lamination process of the invention. In general, copolymerisation and grafting of the silane group(s) containing units to ethylene are well known techniques and well documented in the polymer field and within the skills of a skilled person.

"Silane group(s) containing comonomer" means herein above, below or in claims that the silane group(s) containing units are present as a comonomer. The generally acknowledged techniques of copolymerization of ethylene monomer with silane group(s) containing comonomer is further described later under general description for polymerization process using high pressure and radical initiator and also under experimental part for describing the polymerization of polymer (a). As further reference for such copolymerization process, e.g. patent document, U.S. Pat. No. 4,413,066 can be mentioned.

As to generally acknowledged techniques of grafting the silane group(s) containing units to the backbone of an ethylene polymer, for instance Sioplas and Monosil process can be mentioned. Sioplas process is described e.g. in U.S. Pat. No. 3,646,155 and Monosil process is described e.g. in U.S. Pat. No. 4,117,195. As further examples describing grafting techniques, e.g. WO 2009/056407, U.S. Pat. Nos. 3,646,155 and 4,117,195 can be mentioned.

The general copolymerization and grafting processes are also described in Polymeric Materials Encyclopedia, Vol. 2, CRC Press, 1996 (ISBN 0-8493-2470-X), p. 1552-1565.

It is also well known that the use of peroxide in the grafting embodiment decreases the melt flow rate (MFR) of an ethylene polymer due to a simultaneous crosslinking reaction. As a result, the grafting embodiment can bring limitation to the choice of the MFR of polymer (a) as a starting polymer, which choice of MFR can have an adverse impact on the quality of the polymer at the end use application. Furthermore, the by-products formed from peroxide during the grafting process can have an adverse impact on use life of the polymer composition at end use application.

The copolymerisation of the silane group(s) containing comonomer into the polymer backbone provides more uniform incorporation of the units compared to grafting of the units. Moreover, compared to grafting, the copolymerisation does not require the addition of peroxide after the polymer is produced.

Thus preferably, the silane group(s) containing units are preferably present in polymer (a) as a comonomer. I.e. in case of polymer (a1) the silane group(s) containing units are copolymerised as a comonomer together with the ethylene monomer during the polymerisation process of the polymer (a1). And in case of the polymer (a2) the silane group(s) containing units are copolymerised as a comonomer together with the polar comonomer and ethylene monomer during the polymerisation process of polymer (a2).

The silane group(s) containing unit or, preferably, the silane group(s) containing comonomer, of polymer of ethylene (a), is preferably a hydrolysable unsaturated silane compound represented by the formula (I):

R1SiR2qY3-q    (I)

wherein
R1 is an ethylenically unsaturated hydrocarbyl, hydrocarbyloxy or (meth)acryloxy hydrocarbyl group,
each R2 is independently an aliphatic saturated hydrocarbyl group,
Y which may be the same or different, is a hydrolysable organic group and
q is 0, 1 or 2;

Further suitable silane group(s) containing comonomer is e.g. gamma-(meth)acryl-oxypropyl trimethoxysilane, gamma(meth)acryloxypropyl triethoxysilane, and vinyl triacetoxysilane, or combinations of two or more thereof.

One suitable subgroup of compound of formula (I) is an unsaturated silane compound or, preferably, comonomer of formula (II)

CH2=CHSi(OA)3    (II)

wherein each A is independently a hydrocarbyl group having 1-8 carbon atoms, suitably 1-4 carbon atoms.

The silane group(s) containing unit, or preferably, the comonomer, of the invention, is preferably the compound of formula (II) which is vinyl trimethoxysilane, vinyl bismethoxyethoxysilane, vinyl triethoxysilane, more preferably vinyl trimethoxysilane or vinyl triethoxysilane, more preferably vinyl trimethoxysilane, comonomer.

The amount (mol %) of the silane group(s) containing units present, preferably present as comonomer, in the polymer (a) is preferably of 0.01 to 2.0 mol %, preferably 0.01 to 1.00 mol %, suitably from 0.05 to 0.80 mol %, suitably from 0.10 to 0.60 mol %, suitably from 0.10 to 0.50 mol %, when determined according to "Comonomer contents" as described below under "Determination Methods".

In one preferable embodiment A1, the polymer (a) is a polymer of ethylene which bears silane group(s) containing comonomer (a1). In this embodiment A1, the polymer (a1) does not contain, i.e. is without, a polar comonomer as defined for polymer (a2). Preferably the silane group(s) containing comonomer is the sole comonomer present in the polymer (a1). Accordingly, the polymer (a1) is preferably produced by copolymerising ethylene monomer in a high pressure polymerization process in the presence of silane group(s) containing comonomer using a radical initiator. Preferably the silane group(s) containing comonomer is the only comonomer present in the polymer of ethylene (a1).

In said one preferable embodiment (A1), the polymer (a1) is preferably a copolymer of ethylene with silane group(s) containing comonomer according to formula (I), more preferably with silane group(s) containing comonomer according to formula (II), more preferably with silane group(s) containing comonomer according to formula (II) selected from vinyl trimethoxysilane, vinyl bismethoxyethoxysilane, vinyl triethoxysilane or vinyl trimethoxysilane comonomer, as defined above or in claims. Most preferably the polymer (a1) is a copolymer of ethylene with vinyl trimethoxysilane, vinyl bismethoxyethoxysilane, vinyl triethoxysilane or vinyl trimethoxysilane comonomer, preferably with vinyl trimethoxysilane or vinyl triethoxysilane comonomer, most preferably vinyl trimethoxysilane comonomer. In another preferable embodiment (A2), the polymer (a) is a polymer of ethylene with one or more polar comonomer(s) selected from (C1-C6)-alkyl acrylate or (C1-C6)-alkyl (C1-C6)-alkylacrylate comonomer(s) (a2), which copolymer (a2) bears silane group(s) containing units. In this embodiment (A2) the polymer (a2) is a copolymer of ethylene with one or more, preferably one, polar comonomer(s) selected from (C1-C6)-alkyl acrylate or (C1-C6)-alkyl (C1-C6)-alkylacrylate comonomer(s) and silane group(s) containing comonomer. Preferably, the polar comonomer of the polymer of ethylene (a2) is selected from one of (C1-C6)-alkyl acrylate comonomer, preferably from methyl acrylate, ethyl acrylate or butyl acrylate comonomer. More preferably, the polymer (a2) is a copolymer of ethylene with a polar comonomer selected from methyl acrylate, ethyl acrylate or butyl acrylate comonomer and with silane group(s) containing comonomer. The polymer (a2) is most preferably a copolymer of ethylene with a polar comonomer selected from methyl acrylate, ethyl acrylate or butyl acrylate comonomer and with silane group(s) containing comonomer of compound of formula (I). Preferably, in this embodiment the polar comonomer and the preferable silane group(s) containing comonomer are the only comonomers present in the copolymer of ethylene (a2).

In another preferable embodiment (A3), the polymer (a) is the polymer (a3) which preferably is a polymer of ethylene with one or more, preferably one, comonomer(s) selected from (C1-C8)-alpha-olefin comonomer. In this embodiment polymer (a3) preferably contains silane group(s) containing units, which are grafted to the backbone of polymer (a3).

Most preferably the polymer (a) is selected from polymer (a1) or (a2).

The content of the polar comonomer present in the polymer (a2) is preferably of 0.5 to 30.0 mol %, 2.5 to 20.0 mol %, preferably of 4.5 to 18 mol %, preferably of 5.0 to 18.0 mol %, preferably of 6.0 to 18.0 mol %, preferably of 6.0 to 16.5 mol %, more preferably of 6.8 to 15.0 mol %, more preferably of 7.0 to 13.5 mol %, when measured according to "Comonomer contents" as described below under the "Determination methods".

In said another preferable embodiment (A2), the polymer (a2) is preferably a copolymer of ethylene with the polar comonomer, as defined above, below or in claims, and with silane group(s) containing comonomer according to formula (I), more preferably with silane group(s) containing comonomer according to formula (II), more preferably with silane group(s) containing comonomer according to formula (II) selected from vinyl trimethoxysilane, vinyl bismethoxyethoxysilane, vinyl triethoxysilane or vinyl trimethoxysilane comonomer, as defined above or in claims. Preferably the polymer (a2) is a copolymer of ethylene with methyl acrylate, ethyl acrylate or butyl acrylate comonomer and with vinyl trimethoxysilane, vinyl bismethoxyethoxysilane, vinyl triethoxysilane or vinyl trimethoxysilane comonomer, preferably with vinyl trimethoxysilane or vinyl triethoxysilane comonomer. More preferably the polymer (a2) is a copolymer of ethylene with methyl acrylate comonomer and with vinyl trimethoxysilane, vinyl bismethoxyethoxysilane, vinyl triethoxysilane or vinyl trimethoxysilane comonomer, preferably with vinyl trimethoxysilane or vinyl triethoxysilane comonomer, more preferably with vinyl trimethoxysilane.

Accordingly, the polymer (a2) is most preferably a copolymer of ethylene with methyl acrylate comonomer together with silane group(s) containing comonomer as defined above, below or in claims, preferable a copolymer of ethylene with methyl acrylate comonomer and with vinyl trimethoxysilane or vinyl triethoxysilane comonomer, preferably with methyl acrylate comonomer and with vinyl trimethoxysilane comonomer.

Without binding to any theory, methyl acrylate (MA) is the only acrylate which cannot go through the ester pyrolysis reaction, since does not have this reaction path. Therefore, the polymer (a2) with MA comonomer does not form any harmful free acid (acrylic acid) degradation products at high temperatures, whereby polymer (a2) of ethylene and methyl acrylate comonomer contribute to good quality and life cycle of the end article thereof. This is not the case e.g. with vinyl acetate units of EVA, since EVA forms harmful acetic acid degradation products at high temperatures. Moreover, the other acrylates like ethyl acrylate (EA) or butyl acrylate (BA) can go through the ester pyrolysis reaction, and if degrade, could form volatile olefinic by-products.

The polymer (a) present in the interlayer element, enables, if desired, to decrease the MFR of the polymer (a) compared to prior art and thus offers higher resistance to flow during the production of the preferable layer element (LE) of the invention. As a result, the preferable MFR can further contribute, if desired, to the quality of the layer element (LE), and to an article thereof comprising the layer element (LE).

The melt flow rate, $MFR_2$, of the polymer composition, preferably of polymer (a), is preferably less than 20 g/10 min, preferably less than 15 g/10 min, preferably from 0.1 to 13 g/10 min, preferably from 0.2 to 10 g/10 min, preferably from 0.3 to 8 g/10 min, more preferably from 0.4 to 6, g/10 min (according to ISO 1133 at 190° C. and at a load of 2.16 kg).

The polymer composition, preferably of polymer (a), has preferably a Shear thinning index, $SHI_{0.05/300}$, of 30.0 to 100.0, preferably of 40.0 to 80.0, when measured according to "Rheological properties: Dynamic Shear Measurements (frequency sweep measurements)" as described below under "Determination Methods".

The preferable SHI range further contributes to the advantageous rheological properties of the polymer composition of the interlayer.

Accordingly, the combination of the preferable MFR range and the preferable SHI range of the polymer (a) can further contribute to the quality of the preferable layer element (LE) of the invention. As a result, the preferable MFR of the polymer composition, preferably of the polymer (a) can further contribute, if desired, to the quality of the preferable layer element (LE), to an article, preferably to an article comprising the preferable layer element (LE), of the invention. Moreover, the polymer (a) of the invention can have, if desired, low MFR, for instance lower MFR than that conventionally used in the field of photovoltaic (PV) modules, since the polymer (a) has advantageous flowability and processability properties combined with highly feasible adhesion properties.

The composition, preferably the polymer (a), preferably has a melting temperature of 120° C. or less, preferably 110° C. or less, more preferably 100° C. or less and most preferably 95° C. or less, when measured according to ASTM D3418 as described under "Determination Methods". Preferably the melting temperature of the composition, more preferably the polymer (a) is 70° C. or more, more preferably 75° C. or more, even more preferably 78° C. or more, when measured as described below under "Determination Methods". The preferable melting temperature is beneficial for instance for a lamination process of the preferable layer element (LE) of the invention, since the time of the melting/softening step can be reduced.

Typically, and preferably, the density of the composition, preferably of the polymer of ethylene (a), of the interlayer element is higher than 860 kg/m3. Preferably the density is not higher than 970 kg/m3, and preferably is from 920 to 960 kg/m3, according to ISO 1872-2 as described below under "Determination Methods".

Preferred polymer (a) is a polymer of ethylene (a1) with vinyl trimethoxysilane comonomer or a copolymer of ethylene (a2) with methylacrylate comonomer and with vinyl trimethoxysilane comonomer. The most preferred polymer (a) is a copolymer of ethylene (a2) with methylacrylate comonomer and with vinyl trimethoxysilane comonomer.

The polymer (a) of the composition can be e.g. commercially available or can be prepared according to or analogously to known polymerization processes described in the chemical literature.

In a preferable embodiment the polymer (a), i.e. polymer (a1) or (a2), is produced by polymerizing ethylene suitably with silane group(s) containing comonomer (=silane group(s) containing units present as comonomer) as defined above, and in case of polymer (a2) also with the polar comonomer(s), in a high pressure (HP) process using free radical polymerization in the presence of one or more initiator(s) and optionally using a chain transfer agent (CTA) to control the MFR of the polymer. The HP reactor can be e.g. a well-known tubular or autoclave reactor or a mixture thereof, suitably a tubular reactor. The high pressure (HP) polymerization and the adjustment of process conditions for further tailoring the other properties of the polymer, depending on the desired end application, are well known and described in the literature, and can readily be used by a skilled person. Suitable polymerization temperatures range up to 400° C., suitably from 80 to 350° C. and pressure from 70 MPa, suitably 100 to 400 MPa, suitably from 100 to 350 MPa. The high pressure polymerization is generally performed at pressures of 100 to 400 MPa and at temperatures of 80 to 350° C. Such processes are well known and well documented in the literature and will be further described later below.

The incorporation of the comonomer(s), when present, including the preferred form of silane group(s) containing units as comonomer, to the ethylene monomer and the control of the comonomer feed to obtain the desired final content of said comonomer(s) can be carried out in a well-known manner and is within the skills of a skilled person.

Further details of the production of ethylene (co)polymers by high pressure radical polymerization can be found i.a. in the Encyclopedia of Polymer Science and Engineering, Vol. 6 (1986), pp 383-410 and Encyclopedia of Materials: Science and Technology, 2001 Elsevier Science Ltd.: "Polyethylene: High-pressure, R. Klimesch, D. Littmann and F.-O. Mähling pp. 7181-7184.

Such HP polymerization results in a so called low density polymer of ethylene (LDPE), herein results in polymer (a1) or polymer (a2). The term LDPE has a well-known meaning in the polymer field and describes the nature of polyethylene produced in HP, i.e. the typical features, such as different branching architecture, to distinguish the LDPE from PE produced in the presence of an olefin polymerization catalyst (also known as a coordination catalyst). Although the term LDPE is an abbreviation for low density polyethylene, the term is understood not to limit the density range, but covers the LDPE-like HP polyethylenes with low, medium and higher densities.

The polymer (a3) can be commercially available or be produced in a polymerization process using a coordination catalyst, typically Ziegler-Natta or single site catalyst, as well documented in the literature. The choice of the process, process conditions and the catalyst is within the skills of a skilled person.

Below, the amounts "Based on the amount of the polymer composition of the invention (100 wt %)" means that the amounts of the components present in the polymer composition of the invention total to 100 wt %.

The amount of the polymer (a) is preferably from 50.0 to 99.99 wt %, preferably 60.0 to 99.85 wt %, preferably 70.0 to 99.80 wt %, preferably 75.0 to 99.70 wt %, preferably 90.0 to 99.70 wt %, preferably 95.00 to 99.70 wt %, based on the total amount (100 wt %) of the composition.

The pigment (b) is preferably selected from an inorganic pigment, preferably from an inorganic white pigment. More preferably, the pigment (b) is a titanium dioxide, $TiO_2$. The titanium dioxide, $TiO_2$, is preferably in a form of rutile. Rutile is a mineral which is primarily based on titanium dioxide and has a tetragonal unit cell structure as well known in the art.

The amount of the pigment (b) is preferably from 0.10 to less than 2.00 wt %, preferably from 0.15 to 1.99, preferably from 0.20 to 1.98 wt %, preferably from 0.25 to 1.98 wt %, suitably 0.30 to 1.97 wt %, based on the total amount (100 wt %) of the composition.

The pigment (b) is preferably a commercially available pigment product as provided by suppliers, like Kronos International. For instance Kronos 2220 is an example only of suitable commercial titanium dioxide products. Accordingly, the amount (wt %) of pigment (b) is the amount of pigment product as provided by a supplier. Commercial titanium dioxide product (pigment (b)) may contain other components, like a carrier media, for instance carrier polymer. As said, any such other components of the pigment are counted to the amount of the pigment (b) based on the amount of the polymer composition (100 wt %). I.e. e.g. the optional carrier polymer of the pigment (b) is not counted to the "polymeric component(s)" of the invention, but to the amount of the pigment (b).

In one embodiment, the composition of the invention suitably comprises additive(s) different from the pigment (b). Preferably the composition comprises, based on the total amount (100 wt %) of the composition, 0.0001 to 10 wt % of additives, preferably 0.0001 and 5.0 wt %, like 0.0001 and 2.5 wt %, of the additives different from the pigment (b).

Naturally, the optional and preferable additives are different from polymer (a).

The optional additives are e.g. conventional additives suitable for the desired end application and within the skills of a skilled person, including without limiting to, preferably at least antioxidant(s), UV light stabilizer(s) and/or UV light absorbing agents, and may also include metal deactivator(s), clarifier(s), brightener(s), acid scavenger(s) as well as slip agent(s) etc. Each additive can be used e.g. in conventional amounts, the total amount of additives present in the polymer composition of the invention being preferably as defined above. Such additives are generally commercially available and are described, for example, in "Plastic Additives Handbook", 5th edition, 2001 of Hans Zweifel.

Accordingly, in one preferable embodiment the polymer composition comprises, preferably consists of,
a polymeric component comprising a polymer of ethylene
  (a) which is selected from
    (a1) a polymer of ethylene which bears silane group(s) containing units; or
    (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1);
a pigment (b), wherein the amount of the pigment (b) is less than 2.00 wt %, based on the amount of the polymer composition (100% wt); and
optionally additives, preferably 0.0001 to 10 wt % of additives, preferably 0.0001 and 5.0 wt %, like 0.0001 and 2.5 wt %, of additives different from the pigment (b).

In one preferable embodiment of the invention, the polymer composition comprises, preferably consists of, based on the total amount (100 wt %) of the composition,
50.0 to 99.99 wt %, preferably 60.0 to 99.85 wt %, preferably 70.0 to 99.80 wt %, preferably 75.0 to 99.70 wt %, preferably 90.0 to 99.70 wt %, preferably 95.00 to 99.70 wt %, of a polymeric component comprising, preferably consisting of, a polymer of ethylene (a) which is selected from
  (a1) a polymer of ethylene which bears silane group(s) containing units; or
  (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1);
less than 2.00 wt %, preferably 0.10 to less than 2.00 wt %, preferably from 0.15 to 1.99, preferably from 0.20 to 1.98 wt %, preferably from 0.25 to 1.98 wt %, suitably 0.30 to 1.97 wt %, of pigment (b); and
0 to 10.0 wt %, preferably 0.0001 to 10 wt % of additives, preferably 0.0001 and 5.0 wt %, like 0.0001 and 2.5 wt %, of additives different from the pigment (b).

In a preferable embodiment the polymer composition consists of the polymer (a) as the only polymeric component(s). "Polymeric component(s)" exclude herein any carrier polymer(s) of optional additive, e.g. carrier polymer(s) used in master batch(es) of pigment (b) or additive(s) optionally present in the composition. Such optional carrier polymer(s) are calculated to the amount of the respective additive based on the amount of the polymer composition (100 wt %).

The polymer composition of the invention is other than a master-batch of an additive or of a pigment, which master-batch would be added to main polymer composition intended to final end application.

The polymer composition, preferably the polymer (a), can be crosslinked, if desired.

The polymer composition, preferably the polymer (a), is preferably not crosslinked using peroxide. Preferably the polymer composition is peroxide-free.

If desired, depending on the end application, the polymer composition, preferably the polymer composition, preferably the polymer (a), of the layer element (LE), can be crosslinked via silane group(s) containing units using a silanol condensation catalyst (SCC), which is preferably selected from the group of carboxylates of tin, zinc, iron, lead or cobalt or aromatic organic sulphonic acids, before or during the lamination process of the invention. Such SCCs are for instance commercially available. It is to be understood that the SCC as defined above are those conventionally supplied for the purpose of crosslinking.

The silanol condensation catalyst (SCC), which can optionally be present in the polymer composition, preferably in the polymer composition of the layer element (LE), is more preferably selected from the group C consisting of carboxylates of metals, such as tin, zinc, iron, lead and cobalt; from a titanium compound bearing a group hydrolysable to a Brönsted acid (preferably as described in WO 2011/160964 of Borealis, included herein as reference), from organic bases; from inorganic acids; and from organic acids; suitably from carboxylates of metals, such as tin, zinc, iron, lead and cobalt, from a titanium compound bearing a group hydrolysable to a Brönsted acid or from organic acids, preferably from dibutyl tin dilaurate (DBTL), dioctyl tin dilaurate (DOTL), particularly DOTL; or an aromatic organic sulphonic acid, which is suitably an organic sulphonic acid which comprises the structural element:

$$Ar(SO_3H)_x \qquad (II)$$

wherein Ar is an aryl group which may be substituted or non-substituted, and if substituted, then suitably with at least one hydrocarbyl group up to 50 carbon atoms, and x is at least 1; or a precursor of the sulphonic acid of formula (II) including an acid anhydride thereof or a sulphonic acid of formula (II) that has been provided with a hydrolysable protective group(s), e.g. an acetyl group that is removable by hydrolysis. Such organic sulphonic acids are described e.g. in EP736065, or alternatively, in EP1309631 and EP1309632.

The amount of the optional crosslinking agent (SCC), if present, is preferably of 0 to 0.1 mol/kg, like 0.00001 to 0.1, preferably of 0.0001 to 0.01, more preferably 0.0002 to 0.005, more preferably of 0.0005 to 0.005, mol/kg polymer of ethylene (a). As said preferably no crosslinking agent (SCC) is present in the polymer composition.

In a preferable embodiment of the invention, no silane condensation catalyst (SCC), which is selected from the SCC group of group C consisting of tin-organic catalysts or aromatic organic sulphonic acids, is present in polymer composition. In a further preferable embodiment no peroxide or silane condensation catalyst (SCC), as defined above, is present in the polymer composition. I.e. preferably the polymer composition is peroxide-free and "silane condensation catalyst (SCC) of group C"-free. As already mentioned, with the present polymer composition of the invention, crosslinking of the polymer composition using conventional SCC or peroxide, as mentioned above, below or in claims, can be avoided, which contributes to achieve the good quality of the end applications thereof, for instance of the layer element (LE) of the invention.

The invention provides a use of the polymer composition according to any of the preceding claims for producing a layer element (LE) comprising one or more layer(s), which comprise the polymer composition.

The invention also provides a use of the polymer composition for producing an article comprising the layer element (LE).

Layer Element (LE) of the Invention and End Applications Thereof

The invention also provides a layer element (LE) comprising one or more layers, wherein at least one layer, preferably one layer, comprises, preferably consists of, the polymer composition of the invention comprising a polymeric component comprising a polymer of ethylene
  (a) which is selected from
    (a1) a polymer of ethylene which bears silane group(s) containing units;
    (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1); or
    (a3) a copolymer of ethylene with one or more (C1-C10)-alpha-olefin comonomer which is different from polymer of ethylene (a1) and polymer of ethylene (a2); and
a pigment (b), wherein the amount of the pigment (b) is less than 2.00 wt %, based on the amount of the polymer composition (100% wt).

The layer element (LE) is selected from
a monolayer element comprising the polymer composition as defined above, below or in claims, or
a multilayer element wherein at least one layer comprises the polymer composition as defined above, below or in claims.

Preferably, one or more layer(s) of the layer element (LE) of the invention consist(s) of the polymer composition of the invention. More preferably one layer of the layer element (LE) comprises, preferably consists of, the polymer composition.

The invention also provides an article comprising the layer element (LE) which comprises, preferably consists of, polymer composition of the invention comprising a polymeric component comprising a polymer of ethylene
  (a) which is selected from
    (a1) a polymer of ethylene which bears silane group(s) containing units;
    (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1); or
    (a3) a copolymer of ethylene with one or more (C1-C10)-alpha-olefin comonomer which is different from polymer of ethylene (a1) and polymer of ethylene (a2); and
a pigment (b), wherein the amount of the pigment (b) is less than 2.00 wt %, based on the amount of the polymer composition (100% wt).

The layer element (LE) can be part of the article, e.g. a layer of any shape, like moulded, article, like bottle or container; or the article is, i.e. consists of, the layer element (LE), which is for instance a mono or multilayer film for packaging or thermoforming; or the article is a multilayer assembly of two or more layer elements, wherein one layer element is the layer element (LE) of the invention.

It is to be understood that the part or each of the layer elements of the assembly of the invention typically, and preferably, provide a different functionality into said assembly.

The preferred layer element (LE), preferably of the layer element (LE) of the article, is a monolayer element comprising, preferably consisting of, the polymer composition as defined above, below or in claims.

The article is preferably a multilayer assembly comprising two or more layer elements, wherein at least one layer element is the layer element (LE). A photovoltaic (PV) module is one example of such multilayer assembly which comprises layer elements of different functionalities, as well known in the field and evident for a skilled person.

Accordingly, the article, the preferable assembly, is preferably a photovoltaic (PV) module comprising a photovoltaic element and one or more further layer elements, wherein at least one layer element is the layer element (LE) of the invention comprising, preferably consisting of, the polymer composition which comprises a polymeric component comprising a polymer of ethylene (a) which is selected from
  (a1) a polymer of ethylene which bears silane group(s) containing units;
  (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1); or
  (a3) a copolymer of ethylene with one or more (C1-C10)-alpha-olefin comonomer which is different from polymer of ethylene (a1) and polymer of ethylene (a2); and
a pigment (b), wherein the amount of the pigment (b) is less than 2.00 wt %, based on the amount of the polymer composition (100% wt).

Preferably the photovoltaic (PV) module of the invention comprises, in the given order, a protective front layer element, a front encapsulation layer element, a photovoltaic element, a rear encapsulation layer element and a protective back layer element, wherein at least one layer element is the layer element (LE) of the invention.

It is to be understood herein that the protective front layer element and the front encapsulation layer element of the PV module are on the light receiving side of the photovoltaic (PV) module.

The protective back layer element is referred herein also as backsheet layer element.

The "photovoltaic element" means that the element has photovoltaic activity. The photovoltaic element can be e.g. an element of photovoltaic cell(s), which has a well-known meaning in the art. Silicon based material, e.g. crystalline silicon, is a non-limiting example of materials used in photovoltaic cell(s). Crystalline silicon material can vary with respect to crystallinity and crystal size, as well known to a skilled person. Alternatively, the photovoltaic element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic elements e.g. an ink with photovoltaic activity is printed on one side of a substrate, which is typically a glass substrate.

The photovoltaic element is most preferably an element of photovoltaic cell(s).

"Photovoltaic cell(s)" means herein a layer element(s) of photovoltaic cells, as explained above, together with connectors.

The PV module may optionally comprise a protective cover as a further layer element after the backsheet layer element, in the given order, which can be e.g. a metal frame, such as aluminium frame (with junction box).

All said terms have a well-known meaning in the art.

The materials of the above elements other than the polymer composition of the layer element (LE) are well known in the prior art and can be chosen by a skilled person depending on the desired PV module.

As well known, the elements and the layer structure of the photovoltaic module of the invention can vary depending on the desired type of the PV module. The photovoltaic module can be rigid or flexible. The rigid photovoltaic module can for example contain a rigid protective front layer element, such as a glass element, a rigid or, typically, flexible front encapsulation layer element, a photovoltaic layer element, a rigid or, typically, flexible rear encapsulation layer element and a backsheet layer element which can be rigid or flexible. In flexible modules all the above elements are flexible, whereby the protective front and back as well as the front and rear encapsulation layer elements are typically based on polymeric layer elements.

Moreover, any of the above layer elements of the PV module can be a monolayer element or a multilayer element. Preferably, at least one, preferably both, of the front and back encapsulation layer element of the PV module is/are encapsulation monolayer element(s).

Most preferable embodiment of the photovoltaic (PV) module as the article of the invention is a photovoltaic (PV) module comprising, in the given order, a protective front layer element, a front encapsulation layer element, a photovoltaic element, a rear encapsulation layer element and a protective back layer element, wherein at least the rear encapsulation layer element is the layer element (LE) of the invention, preferably wherein the front encapsulation element and rear encapsulation element are both the layer elements (LE) of the invention.

In this embodiment the other layer elements of the PV module are preferably different from the layer element (LE). I.e. the other layer elements consist of a different polymer compositions compared to the polymer composition of the layer element (LE) as the at least rear encapsulation layer element, preferably polymer composition of the layer elements (LE) as the front encapsulation element and the rear encapsulation element.

It is also possible that also other layer elements, like the protective back layer element, comprise(s) the layer element (LE). Preferably, the rear encapsulation element is the layer element (LE) of the invention, preferably, the front encapsulation element and rear encapsulation element are both the layer elements (LE) of the invention, comprising, preferably consisting of the polymer composition of the invention.

More preferably, the rear encapsulation element is preferably the layer element (LE), preferably, the front encapsulation element and rear encapsulation element are both the layer elements (LE) of the invention which is preferably a monolayer element comprising, preferably consisting of, the composition of the invention.

As a non-limiting example only, the thickness of the front and rear encapsulation layer element is typically up to 2 mm, preferably up to 1 mm, typically 0.3 to 0.6 mm.

As a non-limiting example only, the thickness of the rigid protective front layer element, e.g. glass layer, is typically up to 10 mm, preferably up to 8 mm, preferably 2 to 4 mm. As a non-limiting example only, the thickness of the flexible protective front layer element, e.g. polymeric (multi)layer element, is typically up to 700, like 90 to 700, suitably 100 to 500, such as 100 to 400, µm.

As a non-limiting example only, the thickness of a photovoltaic element, e.g. an element of monocrystalline photovoltaic cell(s), is typically between 100 to 500 microns.

In some embodiments there can be an adhesive layer between the different layer elements of an assembly, preferably of a PV module of the invention, and/or between the layers of a multilayer element of layer element(s), like the layer element (LE), as well known in the art. Such adhesive layers have the function to improve the adhesion between the two elements and have a well-known meaning in the lamination field. The adhesive layers are differentiated from the other functional layer elements of the PV module, e.g. those as specified above, below or in claims, as evident for a skilled person in the art. Preferably, there is no adhesive layer between the protective front layer element and the front encapsulation layer element and/or, preferably, no adhesive layer between the protective back layer element and the rear encapsulation layer element. Preferably, there is no adhesive layer between the layer element (LE) as the rear encapsulation element and the photovoltaic element of the PV module. Further preferably, there is no adhesive layer(s) between the layers of optional multilayer element of the layer element (LE). In one preferable embodiment the layer element (LE) is a monolayer element.

The separate layer elements of PV module can be produced in a manner well known in the photovoltaic field or from the literature; or are already commercially available as layer elements for PV modules. The PV layer element of the layer element (LE), preferably the layer element (LE) as the rear encapsulation layer element, can be produced as described below.

It is also to be understood that part of the layer elements can be in integrated form, i.e. two or more of said PV elements can be integrated together, e.g. by lamination, before subjecting to the below described lamination process of the invention.

FIG. 1 is a schematic picture of a typical PV module of the invention comprising a protective front layer element (1), a front encapsulation layer element (2), a photovoltaic element (3), a rear encapsulation layer element (4) and the protective back layer element (5). In the preferred embodiment, the rear encapsulation layer element (4) is the layer element (LE) of the invention.

The invention further provides a process for producing a layer element (LE), wherein the layer element (LE) is produced by extrusion using typically a conventional extruder as described in the literature. Preferably the monolayer or multilayer element layer element, preferably the monolayer element, as the layer element (LE) is produced by cast film extrusion.

The invention further provides a process for producing an article of the invention, preferably for producing an assembly as defined above, below or in claims, by lamination comprising:
wherein the polymeric layer element (LE) comprises a polymer composition comprising:
(a) a polymer;
and wherein the process comprises the steps of:
(i) assembling step to arrange the at least one substrate element and the at least one polymeric layer element (LE) in form of a multilayer assembly;
(ii) heating step to heat up the multilayer assembly optionally in a chamber at evacuating conditions;

(iii) pressure build up step, where the pressure on the multilayer assembly is gradually increased in a single or multiple steps;
(iv) pressure holding step, where the pressure is kept on the multilayer assembly at the heated conditions for the lamination of the assembly to occur; and
(v) recovering step to cool and remove the obtained multilayer laminate for later use.

The following process conditions of the lamination process are preferable for producing the photovoltaic (PV) module of the invention, and can be combined in any order.

The preferred process for producing the PV module of the invention is a lamination process, wherein the different functional layer elements, typically premade layer elements, of the PV module are laminated to form the integrated final PV module.

The invention thus also provides a preferable lamination process for producing a photovoltaic (PV) module comprising, in the given order, a protective front layer element, a front encapsulation layer element, a photovoltaic element, a rear encapsulation layer element and a protective back layer element, wherein at least the rear encapsulation layer element is the layer element (LE) of the invention, preferably both the front and the rear encapsulation elements are the layer elements (LE) of the invention, comprising, preferably consisting of, the polymer composition which comprises
   a polymeric component comprising a polymer of ethylene
      (a) which is selected from
         (a1) a polymer of ethylene which bears silane group(s) containing units;
         (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1); or
         (a3) a copolymer of ethylene with one or more (C1-C10)-alpha-olefin comonomer which is different from polymer of ethylene (a1) and polymer of ethylene (a2); and
   a pigment (b), wherein the amount of the pigment (b) is less than 2.00 wt %, based on the amount of the polymer composition (100% wt);
wherein the process comprises the steps of:
(i) assembling step to arrange the protective front layer element, the front encapsulation layer element, the photovoltaic element, the rear encapsulation layer element and the protective back layer element, in given order, to form of a photovoltaic module assembly;
(ii) heating step to heat up the photovoltaic module assembly optionally in a chamber at evacuating conditions;
(iii) pressure build up step, where the pressure on the multilayer assembly is gradually increased in a single or multiple steps;
(iv) pressure holding step, where the pressure is kept on the multilayer assembly at the heated conditions for the lamination of the assembly to occur; and
(v) recovering step to cool and remove the obtained photovoltaic module for later use.

The lamination process is carried out in a laminator equipment which can be e.g. any conventional laminator which is suitable for the multilaminate to be laminated. The choice of the laminator is within the skills of a skilled person. Typically the laminator comprises a chamber wherein the heating, optional, and preferable, evacuation, pressing and covering (including cooling) steps (ii)-(iv) take place.

In a preferable lamination process of the invention:
The pressure build up step (iii) is preferably started when the at least one polymeric layer element (LE) reaches a temperature which is 3 to 10° C. higher than the melting temperature of the polymer (a), preferably of the polymer (a1) or (a2), of said polymeric layer element (LE).

The pressure build up step (iii) is preferably started when the at least one polymeric layer element (LE) reaches a temperature of at least of 85° C., suitably to 85 to 150, suitably to 85 to 148° C.

The pressure used in the pressing step (iii) is preferably up to 1000 mbar, preferably 500 to 900 mbar. The above preferable definitions mean that at the end of the pressure holding step (iv) the pressure can be reduced to be 0 mbar before the recovery step (v).

The duration of the heating step (ii) is preferably 0.5 to 7 minutes, preferably 1 to 6 minutes, suitably 1.5 to 5 minutes. The heating step (ii) can be and is typically done step-wise.

The duration of the pressure build up step (iii) is preferably 0.01 to 10 minutes, preferably 0.01 to 5, preferably 0.01 to 3, minutes. The pressure build up step (iii) can be done either in one step or can be done in multiple steps.

The duration of the pressure holding step (iv) is preferably 0.5 to 20, preferably 0.7 to 15, minutes.

Preferably, the sum of the duration of the pressure build up step (iii) and the pressure holding step (iv) is preferably up to 20, preferably 0.5 to 18, preferably 0.5 to 15, minutes.

The sum of the duration of the heating step (ii), pressure build up step (iii) and pressure holding step (iv) is preferably less than 25, preferably from 2 to 22, preferably 5 to 22, minutes.

Determination Methods

Unless otherwise stated in the description or in the experimental part, the following methods were used for the property determinations of the polymer composition, polar polymer and/or any sample preparations thereof as specified in the text or experimental part.

Melt Flow Rate

The melt flow rate (MFR) is determined according to ISO 1133 and is indicated in g/10 min. The MFR is an indication of the flowability, and hence the processability, of the polymer. The higher the melt flow rate, the lower the viscosity of the polymer. The MFR is determined at 190° C. for polyethylene. MFR may be determined at different loadings such as 2.16 kg ($MFR_2$) or 5 kg ($MFR_5$).

Density

Low density polyethylene (LDPE): The density of the polymer was measured according to ISO 1183-2. The sample preparation was executed according to ISO 1872-2 Table 3 Q (compression moulding).

Comonomer Contents:

The Content (Wt % and Mol %) of Polar Comonomer Present in the Polymer and the Content (Wt % and Mol %) of Silane Group(s) Containing Units (Preferably Comonomer) Present in the Polymer Composition (Preferably in the Polymer):

Quantitative nuclear-magnetic resonance (NMR) spectroscopy was used to quantify the comonomer content of the polymer composition or polymer as given above or below in the context.

Quantitative $^1$H NMR spectra recorded in the solution-state using a Bruker Advance III 400 NMR spectrometer operating at 400.15 MHz. All spectra were recorded using a standard broad-band inverse 5 mm probehead at 100° C. using nitrogen gas for all pneumatics. Approximately 200 mg of material was dissolved in 1,2-tetrachloroethane-$d_2$ (TCE-$d_2$) using ditertiarybutylhydroxytoluene (BHT) (CAS 128-37-0) as stabiliser. Standard single-pulse excitation was employed utilising a 30 degree pulse, a relaxation delay of 3 s and no sample rotation. A total of 16 transients were acquired per spectra using 2 dummy scans. A total of 32 k data points were collected per FID with a dwell time of 60 µs, which corresponded to a spectral window of approx. 20 ppm. The FID was then zero filled to 64 k data points and an exponential window function applied with 0.3 Hz linebroadening. This setup was chosen primarily for the ability to resolve the quantitative signals resulting from methylacrylate and vinyltrimethylsiloxane copolymerisation when present in the same polymer.

Quantitative $^1$H NMR spectra were processed, integrated and quantitative properties determined using custom spectral analysis automation programs. All chemical shifts were internally referenced to the residual protonated solvent signal at 5.95 ppm. When present characteristic signals resulting from the incorporation of vinylacytate (VA), methyl acrylate (MA), butyl acrylate (BA) and vinyltrimethylsiloxane (VTMS), in various comonomer sequences, were observed (Randell89). All comonomer contents calculated with respect to all other monomers present in the polymer.

The vinylacytate (VA) incorporation was quantified using the integral of the signal at 4.84 ppm assigned to the *VA sites, accounting for the number of reporting nuclie per comonomer and correcting for the overlap of the OH protons from BHT when present:

$$VA=(I^*_{VA}-(I_{ArBHT})/2)/1$$

The methylacrylate (MA) incorporation was quantified using the integral of the signal at 3.65 ppm assigned to the 1MA sites, accounting for the number of reporting nuclie per comonomer:

$$MA=I_{1MA}/3$$

The butylacrylate (BA) incorporation was quantified using the integral of the signal at 4.08 ppm assigned to the 4BA sites, accounting for the number of reporting nuclie per comonomer:

$$BA=I_{4BA}/2$$

The vinyltrimethylsiloxane incorporation was quantified using the integral of the signal at 3.56 ppm assigned to the 1VTMS sites, accounting for the number of reporting nuclei per comonomer:

$$VTMS=I_{1VTMS}/9$$

Characteristic signals resulting from the additional use of BHT as stabiliser, were observed. The BHT content was quantified using the integral of the signal at 6.93 ppm assigned to the ArBHT sites, accounting for the number of reporting nuclei per molecule:

$$BHT=I_{ArBHT}/2$$

The ethylene comonomer content was quantified using the integral of the bulk aliphatic (bulk) signal between 0.00-3.00 ppm. This integral may include the IVA (3) and αVA (2) sites from isolated vinylacetate incorporation, □MA and αMA sites from isolated methylacrylate incorporation, 1BA (3), 2BA (2), 3BA (2), □BA (1) and αBA (2) sites from isolated butylacrylate incorporation, the □VTMS and αVTMS sites from isolated vinylsilane incorporation and the aliphatic sites from BHT as well as the sites from polyethylene sequences. The total ethylene comonomer content was calculated based on the bulk integral and compensating for the observed comonomer sequences and BHT:

$$E=(\tfrac{1}{4})^*[I_{bulk}-5^*VA-3^*MA-10^*BA-3^*VTMS-21^*BHT]$$

It should be noted that half of the a signals in the bulk signal represent ethylene and not comonomer and that an insignificant error is introduced due to the inability to compensate for the two saturated chain ends (S) without associated branch sites. The total mole fractions of a given monomer (M) in the polymer was calculated as:

$$fM=M/(E+VA+MA+BA+VTMS)$$

The total comonomer incorporation of a given monomer (M) in mole percent was calculated from the mole fractions in the standard manner:

$$M[\text{mol \%}]=100^*fM$$

The total comonomer incorporation of a given monomer (M) in weight percent was calculated from the mole fractions and molecular weight of the monomer (MW) in the standard manner:

$$M[\text{wt \%}]=100^*(fM^*MW)/((fVA^*86.09)+(fMA^*86.09)+(fBA^*128.17)+(fVTMS^*148.23)+((1-fVA-fMA-fBA-fVTMS)^*28.05))$$

randall89: J. Randall, Macromol. Sci., Rev. Macromol. Chem. Phys. 1989, C29, 201. If characteristic signals from other specific chemical species are observed the logic of quantification and/or compensation can be extended in a similar manor to that used for the specifically described chemical species. That is, identification of characteristic signals, quantification by integration of a specific signal or signals, scaling for the number of reported nuclei and compensation in the bulk integral and related calculations. Although this process is specific to the specific chemical species in question the approach is based on the basic principles of quantitative NMR spectroscopy of polymers and thus can be implemented by a person skilled in the art as needed.

Adhesion Test:

The adhesion test is performed on laminated strips, the encapsulant film and backsheet is peeled of in a tensile testing equipment while measuring the force required for this.

A laminate consisting of glass, 2 encapsulant films and backsheet is first laminated. Between the glass and the first encapsulant film a small sheet of Teflon is inserted at one of the ends, this will generate a small part of the encapsulants and backsheet that is not adhered to the glass. This part will be used as the anchoring point for the tensile testing device.

The laminate is then cut along the laminate to form a 15 mm wide strip, the cut goes through the backsheet and the encapsulant films all the way down to the glass surface.

The laminate is mounted in the tensile testing equipment and the clamp of the tensile testing device is attached to the end of the strip.

The pulling angle is 90° in relation to the laminate and the pulling speed is 14 mm/min.

The pulling force is measured as the average during 50 mm of peeling starting 25 mm into the strip.

The average force over the 50 mm is divided by the width of the strip (15 mm) and presented as adhesion strength (N/cm).

Rheological Properties:

Dynamic Shear Measurements (Frequency Sweep Measurements)

The characterization of melt of polymer composition or polymer as given above or below in the context by dynamic shear measurements complies with ISO standards 6721-1 and 6721-10. The measurements were performed on an Anton Paar MCR501 stress controlled rotational rheometer, equipped with a 25 mm parallel plate geometry. Measurements were undertaken on compression moulded plates, using nitrogen atmosphere and setting a strain within the linear viscoelastic regime. The oscillatory shear tests were done at 190° C. applying a frequency range between 0.01 and 600 rad/s and setting a gap of 1.3 mm.

In a dynamic shear experiment the probe is subjected to a homogeneous deformation at a sinusoidal varying shear strain or shear stress (strain and stress controlled mode, respectively). On a controlled strain experiment, the probe is subjected to a sinusoidal strain that can be expressed by $$\gamma(t)=\gamma_0 \sin(\omega t) \quad (1)$$

If the applied strain is within the linear viscoelastic regime, the resulting sinusoidal stress response can be given by $$\sigma(t)=\sigma_0 \sin(\omega t+\delta) \quad (2)$$

where
$\sigma_0$ and $\gamma_0$ are the stress and strain amplitudes, respectively
$\omega$ is the angular frequency
$\delta$ is the phase shift (loss angle between applied strain and stress response)
t is the time Dynamic test results are typically expressed by means of several different rheological functions, namely the shear storage modulus G', the shear loss modulus, G", the complex shear modulus, G*, the complex shear viscosity, η*, the dynamic shear viscosity, η', the out-of-phase component of the complex shear viscosity η" and the loss tangent, tan δ which can be expressed as follows:

$$G' = \frac{\sigma_0}{\gamma_0}\cos\delta \text{ [Pa]} \quad (3)$$

$$G'' = \frac{\sigma_0}{\gamma_0}\sin\delta \text{ [Pa]} \quad (4)$$

$$G^* = G' + iG'' \text{ [Pa]} \quad (5)$$

$$\eta^* = \eta' - i\eta'' \text{ [Pa·s]} \quad (6)$$

$$\eta' = \frac{G''}{\omega} \text{ [Pa·s]} \quad (7)$$

$$\eta'' = \frac{G'}{\omega} \text{ [Pa·s]} \quad (8)$$

Besides the above mentioned rheological functions one can also determine other rheological parameters such as the so-called elasticity index EI(x). The elasticity index EI(x) is the value of the storage modulus, G' determined for a value of the loss modulus, G" of x kPa and can be described by equation (9).

$$EI(x)=G' \text{ for } (G''=x \text{ kPa})[\text{Pa}] \quad (9)$$

For example, the EI(5 kPa) is the defined by the value of the storage modulus G', determined for a value of G" equal to 5 kPa.

Shear Thinning Index ($SHI_{0.05/300}$) is defined as a ratio of two viscosities measured at frequencies 0.05 rad/s and 300 rad/s, $\mu_{0.05}/\mu_{300}$.

REFERENCES

[1] Rheological characterization of polyethylene fractions" Heino, E. L., Lehtinen, A., Tanner J., Seppälä, J., Neste Oy, Porvoo, Finland, Theor. Appl. Rheol., Proc. Int. Congr. Rheol., 11th (1992), 1, 360-362

[2] The influence of molecular structure on some rheological properties of polyethylene", Heino, E. L., Borealis Polymers Oy, Porvoo, Finland, Annual Transactions of the Nordic Rheology Society, 1995).

[3] Definition of terms relating to the non-ultimate mechanical properties of polymers, Pure & Appl. Chem., Vol. 70, No. 3, pp. 701-754, 1998.

Melting Temperature, Crystallization Temperature ($T_{cr}$), and Degree of Crystallinity The melting temperature Tm of the used polymers was measured in accordance with ASTM D3418. Tm and Tcr were measured with Mettler TA820 differential scanning calorimetry (DSC) on 3+-0.5 mg samples. Both crystallization and melting curves were obtained during 10° C./min cooling and heating scans between −10 to 200° C. Melting and crystallization temperatures were taken as the peaks of endotherms and exotherms. The degree of crystallinity was calculated by comparison with heat of fusion of a perfectly crystalline polymer of the same polymer type, e.g. for polyethylene, 290 J/g.

Optical Measurements: Reflectance and Transmittance

Transmittance and reflectance were measured directly on the layer element of the sample specimens (monolayer film of thickness of 0.45 mm) using a Bentham PVE300 equipped with a monochromator and a 150 mm integrating sphere. The layer element under investigation was placed in front of the integrating sphere for transmittance measurements or behind the sphere for reflectance measurements and measurement was performed at 5 nm intervals between wave length of light of 300 and 1100 nm. The solar-weighted transmittance wave length of light of between 300-400 nm and the reflectance wave length of light of between 400-1100 nm were obtained by calculation according to Formula 1 where $\tau_w$ refers to the weighted transmittance or reflectance; $\tau$, the measured transmittance or reflectance of the specimen; $\lambda$, the wavelength of light; and $E_{p\lambda}$, the reference spectral photon irradiance (as given in IEC60904-3). Herein the reflectance was measured and the values of the sample specimens are given in the below experimental part.

$$\tau_w = \frac{\int \tau[\lambda]E_{p\lambda}[\lambda]d\lambda}{\int E_{p\lambda}[\lambda]d\lambda}$$

Experimental Part
Preparation of Inventive Polymer Examples (Copolymer of Ethylene with Methyl Acrylate Comonomer and with Vinyl Trimethoxysilane Comonomer)

Polymerisation of the polymer (a) of the inventive layer element (LE) IE1 and of the reference layer element CE1 with no pigment (b):

Inventive polymer (a) was produced in a commercial high pressure tubular reactor at a pressure 2500-3000 bar and max temperature 250-300° C. using conventional peroxide initiator. Ethylene monomer, methyl acrylate (MA) polar comonomer and vinyl trimethoxy silane (VTMS) comonomer (silane group(s) containing comonomer (b)) were added to the reactor system in a conventional manner. CTA was used to regulate MFR as well known for a skilled person. After having the information of the property balance desired for the inventive final polymer (a), the skilled person can control the process to obtain the inventive polymer (a).

The amount of the vinyl trimethoxy silane units, VTMS, (=silane group(s) containing units), the amount of MA and MFR$_2$ are given in the table 1.

The properties in below tables were measured from the polymer (a) as obtained from the reactor or from a layer sample as indicated below.

TABLE 1

Product properties of Inventive Examples

| Test polymer<br>Properties of the polymer<br>obtained from the reactor | Inv. Ex. 1 |
|---|---|
| MFR$_{2, 16}$, g/10 min | 3.0 |
| acrylate content, mol % (wt %) | MA 8.6 (22) |
| Melt Temperature, ° C. | 90 |
| VTMS content, mol % (wt %) | 0.38 (1.7) |
| Density, kg/m$^3$ | 946 |
| SHI (0.05/300), 150° C. | 70 |

In above table 1 and below MA denotes the content of Methyl Acrylate comonomer present in the polymer and, respectively, VTMS content denotes the content of vinyl trimethoxy silane comonomer present in the polymer. The polymer (a) was used in the below tests.

Pigment (b): Kronos 2220 product was used as pigment (b) which is titanium dioxide, TiO$_2$, product in rutile form. Namely, Kronos 2220 is rutile pigment produced by the chloride process, CAS No. 13463-67-7, TiO2 content (DIN EN ISO 591) 92.5% or more, supplied by Kronos International.

Preparation of the layer element (LE) (monolayer film) samples consisting of the reference polymer composition CE1 (no pigment (b)) and inventive polymer compositions IE1 to IE5 same base polymer with different amounts of pigment (b)).

TABLE 2 polymer compositions of the layer element (LE) (monolayer film) samples

| Sample | wt %* of polymer (a) | wt %* of pigment (b)<br>(TiO$_2$ product) |
|---|---|---|
| CE1 | 100 | 0 |
| IE1 | 98.05 | 1.95 |

*wt % of polymer (a) and pigment (b) are based on the total amount of the polymer composition used for the layer element (film) samples The inventive and comparative compositions were produced in film cast extrusion line by adding to the extruder the polymer (a) without pigment (b) in case of CE1 and in case of IE1 by combining the polymer (a) with pigment (b) in amounts as given above, and then producing a layer element (monolayer film) samples of said compositions. The equipment and extrusion and layer element production conditions are described below.

Equipment: "Plastikmaschinenbau PM30" line

Used Equipment Settings and Preparation Conditions:

Die gap: 0.5 mm

Screw speed: 98 rpm (51-53 kg/h)

Line speed: 2.9 m/min

Screen: 400/900/2500/900/400

Chill-roll temperature: 10° C.-15° C.

Temperature profile:

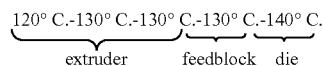

Film thickness of the samples: 450 m
Film width: 550 mm
Melt temperature of the samples: 140° C.
Melt pressure of the samples: 50-53 bar throughput
Throughput of the samples: 51-53 kg/h
Transmittance was measured from the film samples as such. The measurement method is described above under "Determination methods".

TABLE 3

Transmittance

Total transmittance 300-400 nm:

| CE1 | 89.4 |
|---|---|
| IE1 | 0.2 |

Lamination

Photovoltaic modules were prepared by laminating a protective front layer element (glass layer)/a front encapsulation layer element (transparent, consisting solely from polymer (a), prepared as CE1)/a photovoltaic element (soldered Si-cells/a rear encapsulation layer element (test layer element, i.e. CE1 (transparent polymer (a) without pigment (b)) or IE1 (white, with pigment (b) in amounts give above))/a protective back layer element (glass layer), all 5 layer elements, in a vacuum laminator (ICOLAM 25/15, supplied by Meier Vakuumtechnik GmbH) using the following lamination conditions; pins-up time: 2 min, evacuation time: 5 min, pressing time: 3 min, holding time: 7 min at a temperature of 145° C. and a pressure of 800 mbar. Glass layer elements, namely TVG Z-704-194 from FISolar with dimensions of 1670*983 mm and a thickness of 2 mm were used as the protective front layer element and the protective back layer element. The solar cells as PV cell element had been automatically stringed by 10 cells in series with a distance between the cells of 1.5 mm. After the front encapsulant element as defined above was put on the front protective glass element, then the solar cells were put on the front encapsulant element with 6 rows of each 10 cells with a distance between the rows of ±2.5 mm to have a total of 60 cells in the solar module as a standard module. Then the ends of the solar cells are soldered together to have a fully integrated connection as well known by the PV module producers. A total number of 60 Si cells, soldered and connected in series (6*10 cells), were used per laminated module. Then the rear encapsulation element as defined above was subjected to the other side of the solar cell element and the protective back layer element (glass layer) was assembled on other side of the rear encapsulation element. After above described lamination, the modules were equipped with junction box to facilitate current-voltage measurements. The obtained laminate samples were used in Power output measurements as described below.

Power Output Measurements

Current-voltage characteristics were obtained using a Berger Lichttechnik solar simulator with a flash pulse of 2 ms and a light intensity of 1000 W/m$^2$.

The module was mounted vertically on a structure placed about 3.5 m from the lamp. The area between the lamp and the module, as well as the area behind the module, was covered with black walls and curtains in order to avoid reflections. The irradiance in the plan of the module was measured using a reference cell placed near the module, and the temperature was measured using a thermometer placed in the area of measurement. These parameters (irradiance and temperature) were used to correct the resulting IV curve to STC conditions (25° C. and 1000 W/m²), as required by IEC60904 standard.

Table 4 shows a significant increase in short circuit current of the inventive PV test module samples compared to the reference PV module sample. The increase is believed to be due to photon reflection from the white rear encapsulation layer element as discussed above. The results are average values from 3 reference PV modules and 3 modules of each inventive PV modules.

TABLE 4

|  | CE1 | IE1 |
| --- | --- | --- |
| Maximum power ($P_{max}$, 60-cell module) | 274.20 W | 278.73 |
| $P_{max}$ increase |  | 1.65% |
| Short-circuit current ($I_{sc}$, 60-cell module) | 9.24 A | 9.45 A |
| $I_{sc}$ increase |  | 2.35% |

Storage Stability

The extremely good storage stability of the polymer composition of the invention at 30° C. is shown in Table 5:

TABLE 5

| Sample | $MFR_2$ 0 weeks | $MFR_2$ 2 weeks | $MFR_2$ 4 weeks | $MFR_2$ 6 weeks | $MFR_2$ 8 weeks |
| --- | --- | --- | --- | --- | --- |
| IE1 | 4.58 | 4.48 | 4.35 | 4.40 | 4.29 |

The invention claimed is:

1. A photovoltaic (PV) module comprising, in the given order, a protective front layer element, a front encapsulation layer element, a photovoltaic element, a rear encapsulation layer element and a protective back layer element,
   wherein at least the rear encapsulation layer element is a layer element (LE),
   wherein the layer element (LE) is a layer element of one or more layers, wherein one or more of the one or more layers, comprises a polymer composition consisting of:
   a polymeric component comprising a polymer of ethylene (a) which is selected from
      (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units;
   a pigment (b), wherein the amount of the pigment (b) is less than 2.00 wt %, based on the amount of the polymer composition (100% wt), and wherein the pigment (b) is selected from white inorganic pigments; and
   0.0001 to 10.0 wt % of additives, wherein the additives are different than the pigment (b) and are selected from the group consisting of antioxidants, UV light stabilizers and/or UV light absorbing agents, metal deactivators, clarifiers, brighteners, acid scavengers, and slip agents.

2. The photovoltaic (PV) module according to claim 1, wherein the amount of the pigment (b) is from 0.10 to less than 2.00 wt %.

3. The photovoltaic (PV) module according to claim 1, wherein the amount of the polar comonomer in the copolymer of ethylene (a2) is of 0.5 to 30.0 mol %.

4. The photovoltaic (PV) module according to claim 1, wherein the silane group(s) containing unit of copolymer of ethylene (a2) is a hydrolysable unsaturated silane compound represented by the formula (I):

R1SiR2qY3-q     (I)

wherein;
R1 is an ethylenically unsaturated hydrocarbyl, hydrocarbyloxy or (meth)acryloxy hydrocarbyl group,
each R2 is independently an aliphatic saturated hydrocarbyl group,
Y which may be the same or different, is a hydrolysable organic group and
q is 0, 1 or 2.

5. The photovoltaic (PV) module according to claim 1, wherein the copolymer of ethylene (a2) has at least one of
a melt flow rate, $MFR_2$, of less than 20 g/10 min, (according to ISO 1133 at 190° C. and at a load of 2.16 kg); and
a melting temperature, Tm, of less than 100°C.

6. The photovoltaic (PV) module according to 1, wherein the protective front layer element and/or the protective back layer element are rigid layer element(s).

7. A process for producing a photovoltaic (PV) module according to claim 1,
the process comprising the steps of:
   (i) assembling step to arrange the protective front layer element, the front encapsulation layer element, the photovoltaic element, the rear encapsulation layer element and the protective back layer element, in given order, to form of a photovoltaic module assembly;
   (ii) heating step to heat up the photovoltaic module assembly optionally in a chamber at evacuating conditions;
   (iii) pressure build up step, where the pressure on the multilayer assembly is gradually increased in a single or multiple steps;
   (iv) pressure holding step, where the pressure is kept on the multilayer assembly at the heated conditions for the lamination of the assembly to occur; and
   (v) recovering step to cool and remove the obtained photovoltaic module for later use.

8. The process according to claim 7, wherein the amount of the pigment (b) is from 0.10 to less than 2.00 wt %.

9. The process according to claim 7, wherein the amount of the polar comonomer in the copolymer of ethylene (a2) is of 0.5 to 30.0 mol %.

10. The process according to claim 7, wherein the silane group(s) containing unit of copolymer of ethylene (a2) is a hydrolysable unsaturated silane compound represented by the formula (I):

R1SiR2qY3-q     (I)

wherein;
R1 is an ethylenically unsaturated hydrocarbyl, hydrocarbyloxy or (meth)acryloxy hydrocarbyl group,
each R2 is independently an aliphatic saturated hydrocarbyl group,
Y which may be the same or different, is a hydrolysable organic group and
q is 0, 1 or 2.

11. The process according to claim 7, wherein the copolymer of ethylene (a2) has at least one of a melt flow rate, MFR$_2$, of less than 20 g/10 min, (according to ISO 1133 at 190° C. and at a load of 2.16 kg); and a melting temperature, Tm, of less than 100° C.

* * * * *

UNITED STATES PATENT AND TRADEMARK OFFICE
CERTIFICATE OF CORRECTION

PATENT NO. : 11,552,210 B2
APPLICATION NO. : 16/619025
DATED : January 10, 2023
INVENTOR(S) : Stefan Hellström et al.

It is certified that error appears in the above-identified patent and that said Letters Patent is hereby corrected as shown below:

On the Title Page

Item (12): delete "Hellstrom et al." and insert --Hellström et al.--

Item (72) Inventors: delete "Stefan Hellstrom, Stenungsund, (SE)" and insert --Stefan Hellström, Stenungsund, (SE)--

Signed and Sealed this
Eleventh Day of July, 2023

Katherine Kelly Vidal
*Director of the United States Patent and Trademark Office*